(12) United States Patent
Alobaidan

(10) Patent No.: US 11,139,614 B2
(45) Date of Patent: Oct. 5, 2021

(54) AUTO-EJECT APPARATUS FOR CHARGING CORD

(71) Applicant: Khaled Waleed Alobaidan, Kuwait (SA)

(72) Inventor: Khaled Waleed Alobaidan, Kuwait (SA)

( * ) Notice: Subject to any disclaimer, the term of this patent is extended or adjusted under 35 U.S.C. 154(b) by 348 days.

(21) Appl. No.: 16/455,483

(22) Filed: Jun. 27, 2019

(65) Prior Publication Data

US 2020/0412053 A1 Dec. 31, 2020

(51) Int. Cl.
| | |
|---|---|
| *H02J 7/00* | (2006.01) |
| *H01R 13/635* | (2006.01) |
| *G01R 31/367* | (2019.01) |
| *G01R 31/389* | (2019.01) |
| *G01R 31/3835* | (2019.01) |
| *H01R 31/06* | (2006.01) |

(52) U.S. Cl.
CPC ......... *H01R 13/635* (2013.01); *G01R 31/367* (2019.01); *G01R 31/389* (2019.01); *G01R 31/3835* (2019.01); *H01R 31/065* (2013.01); *H02J 7/00* (2013.01); *H02J 7/0042* (2013.01)

(58) Field of Classification Search
None
See application file for complete search history.

(56) References Cited

U.S. PATENT DOCUMENTS

| | | | |
|---|---|---|---|
| 10,050,393 B1* | 8/2018 | Calabrese ............ | H01R 13/635 |
| 10,377,328 B2* | 8/2019 | Gachuz Navarro .... | B60R 16/03 |
| 2006/0024997 A1* | 2/2006 | Teicher ................. | H01R 29/00 439/217 |
| 2008/0185992 A1* | 8/2008 | Hoffman ............... | H02J 7/0045 320/110 |
| 2009/0278491 A1* | 11/2009 | Grider .................... | B60L 53/16 320/107 |
| 2011/0241605 A1* | 10/2011 | Zhang ................... | H01M 10/44 320/107 |
| 2012/0126956 A1* | 5/2012 | Trzecieski ............. | G08C 17/00 340/12.5 |
| 2013/0049701 A1* | 2/2013 | Pisharodi ................. | H02J 7/02 320/148 |
| 2013/0183864 A1* | 7/2013 | Hopkins ............... | H01R 13/46 439/660 |

(Continued)

*Primary Examiner* — Arun C Williams
(74) *Attorney, Agent, or Firm* — Elizabeth Yang

(57) ABSTRACT

An auto-eject apparatus for ejecting a charging cord from a communication device after the battery is substantially charged. The auto-eject apparatus serves to provides a connector that ejects a proximal end of a charging cord that is attached to a communication device after the battery of the communication device is substantially charged. A processor component operatively connects to the pins. The processor component runs a software program that detects when the battery is finished charging. The software program may be a battery monitoring program. After detecting a full charge, the software program triggers two pins in the apparatus to mechanically eject the proximal end of the charging cord. The pins axially extend and retract in relation to the housing, such that axially extending the pins urges the connector to disengage from the communication device A linkage assembly articulates between the processor component and the pins to axially displace the pins.

20 Claims, 2 Drawing Sheets

(56) References Cited

U.S. PATENT DOCUMENTS

2015/0305409 A1* 10/2015 Verleur ................ H02J 7/0022
131/329
2017/0256970 A1* 9/2017 Ciesinski ........... H01R 13/6397

* cited by examiner

AUTO-EJECT APPARATUS FOR CHARGING CORD

FIELD OF THE INVENTION

The present invention relates generally to an auto-eject apparatus for charging cord. More so, the present invention relates to an auto-eject apparatus that provides a connector that ejects a proximal end of a charging cord attached to a communication device after the battery of the communication device is substantially charged; whereby a software program detects when the battery is substantially charged, and triggers two pins to mechanically eject the proximal end of the charging cord.

BACKGROUND OF THE INVENTION

The following background information may present examples of specific aspects of the prior art (e.g., without limitation, approaches, facts, or common wisdom) that, while expected to be helpful to further educate the reader as to additional aspects of the prior art, is not to be construed as limiting the present invention, or any embodiments thereof, to anything stated or implied therein or inferred thereupon.

Typically, smart phones consume large amounts of energy—especially when connected to the internet. In many regards, the biggest limitation to these devices is their relatively short battery life. Smartphone all typically require a daily charging. A charging device, such as a cable with a USB prong is often used i.e., C-type chargers.

Generally, these charging devices include standard plug-in wall cords, and/or power cords that plug into computer USB ports. However, this may not always be convenient to rely on these long charging cables. It may also be inconvenient to carry such chargers everywhere. Further, it can be problematic to return the smart phone to the same charging outlet to charge up at the end of the day. Also, by overcharging the smartphone battery, the life of the battery is significantly reduced.

Other proposals have involved phone charging devices and methods to terminate the charge. The problem with these phone charging devices and methods to terminate the charge is that they do not automatically disconnect the charging cable from the smartphone or other communication device. Even though the above cited phone charging devices and methods to terminate the charge meet some of the needs of the market, an auto-eject apparatus for charging cord that provides a connector that ejects a proximal end of a charging cord attached to a communication device after the battery of the communication device is substantially charged; whereby a software program detects when the battery is substantially charged, and triggers two pins to mechanically eject the proximal end of the charging cord, is still desired.

SUMMARY

Illustrative embodiments of the disclosure are generally directed to an auto-eject apparatus for charging cord. The auto-eject apparatus serves to provides a connector that ejects a proximal end of a charging cord that is attached to a communication device after the battery of the communication device is substantially charged. A software program in the apparatus detects when the battery is substantially charged. After detecting a substantially full charge, the software program triggers two pins in the apparatus to mechanically eject the proximal end of the charging cord.

In one aspect, an auto-eject apparatus for charging cord, comprises:

a connector defined by a housing, a device end, and a cord end, the device end being operable to detachably attach to a communication device having a battery, the cord end being operable to detachably attach to a proximal end of a charging cord;

a pair of pins extending from the device end of the connector, the pins operable to axially extend and retract in relation to the housing, whereby axially extending the pins urges the connector to disengage from the communication device; and a processor component operatively connected to the pins, the processor component operating a software program operable to detect when the battery is substantially charged, the software program triggering the pins to axially extend, whereby a substantially charged battery causes the connector to disengage from the communication device.

In another aspect, the apparatus further comprises a linkage assembly operable between the processor and the pins.

In another aspect, the linkage assembly articulates to axially extend and retract the pins.

In another aspect, the pins axially retract when a force is applied.

In another aspect, the charging cord comprises a USB Type-C or a USB-C charging cord.

In another aspect, the housing has a flat, rectangular shape.

In another aspect, the communication device includes at least one of the following: a smart phone, a tablet, a laptop, a digital camera, a mouse, a keyboard, a scanner, a media device, an external hard drive, and a flash drive.

In another aspect, the software program is operable to scan the voltage of the battery.

In another aspect, the software program is operable to monitor the battery power rate, the battery capacity, and the battery power state.

In another aspect, the software program is operable to measure the internal resistance by a pulse of AC impedance method, count coulombs, and taking a snapshot of the battery with Electrochemical Impedance Spectroscopy.

In another aspect, the charging cord has a distal end opposing the proximal end.

In another aspect, the processor component comprises a printed circuit board.

In another aspect, the software program comprises a battery monitoring software application.

One objective of the present invention is to help increase the lifespan of a mobile communication device.

Another objective is to automate the disconnection of the charging cord from the communication device.

Another objective is to construct the device to be operational with all electronic devices that use rechargeable batteries, including electric vehicles, drones, children electrical cars, toys, etc.

Yet another objective is to provide an inexpensive to manufacture auto-eject apparatus for charging cords.

Other systems, devices, methods, features, and advantages will be or become apparent to one with skill in the art upon examination of the following drawings and detailed description. It is intended that all such additional systems, methods, features, and advantages be included within this description, be within the scope of the present disclosure, and be protected by the accompanying claims and drawings.

BRIEF DESCRIPTION OF THE DRAWINGS

The invention will now be described, by way of example, with reference to the accompanying drawings, in which.

Like reference numerals refer to like parts throughout the various views of the drawings.

DETAILED DESCRIPTION OF THE INVENTION

The following detailed description is merely exemplary in nature and is not intended to limit the described embodiments or the application and uses of the described embodiments. As used herein, the word "exemplary" or "illustrative" means "serving as an example, instance, or illustration." Any implementation described herein as "exemplary" or "illustrative" is not necessarily to be construed as preferred or advantageous over other implementations. All of the implementations described below are exemplary implementations provided to enable persons skilled in the art to make or use the embodiments of the disclosure and are not intended to limit the scope of the disclosure, which is defined by the claims. For purposes of description herein, the terms "upper," "lower," "left," "rear," "right," "front," "vertical," "horizontal," and derivatives thereof shall relate to the invention as oriented in FIG. 1. Furthermore, there is no intention to be bound by any expressed or implied theory presented in the preceding technical field, background, brief summary or the following detailed description. It is also to be understood that the specific devices and processes illustrated in the attached drawings, and described in the following specification, are simply exemplary embodiments of the inventive concepts defined in the appended claims. Specific dimensions and other physical characteristics relating to the embodiments disclosed herein are therefore not to be considered as limiting, unless the claims expressly state otherwise.

Figure 1:
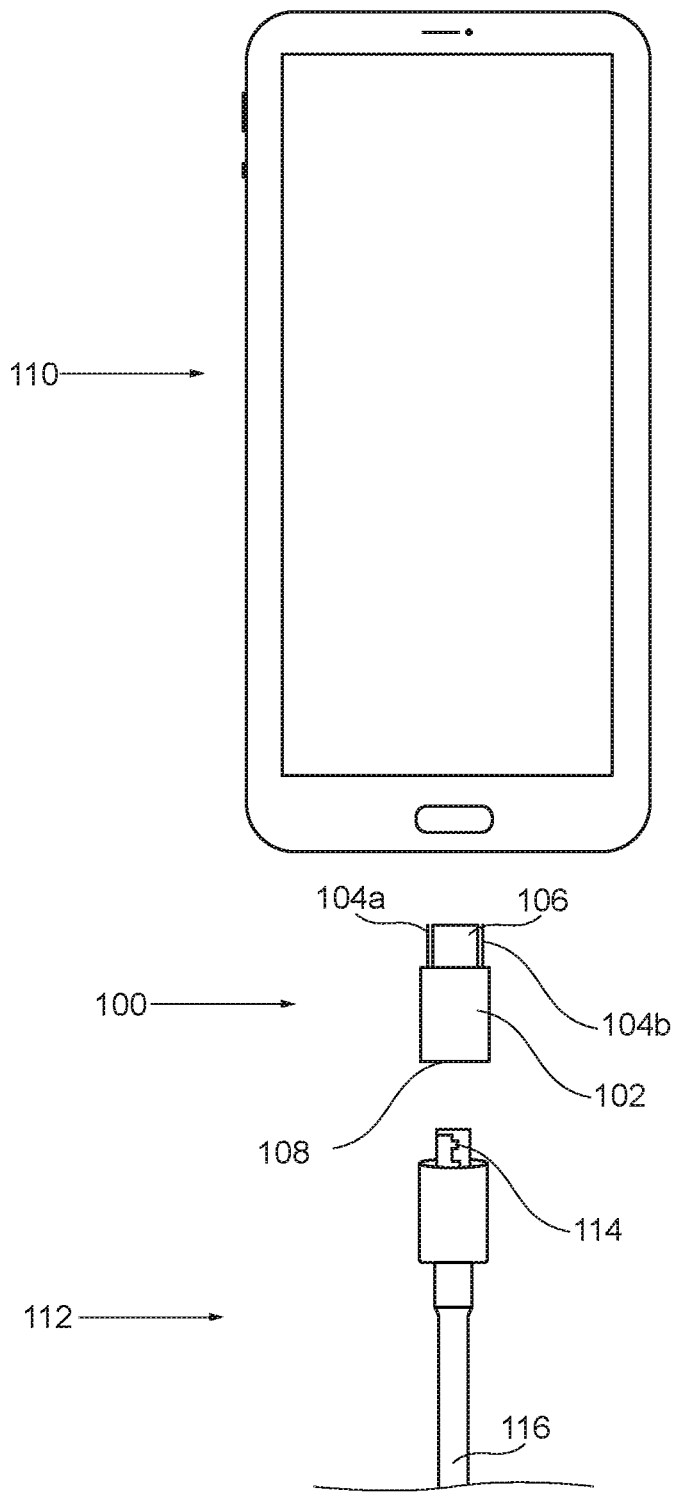
FIG. 1 illustrates a perspective view of an exemplary auto-eject apparatus for ejecting a charging cord from a communication device, in accordance with an embodiment of the present invention.
Figure 2:
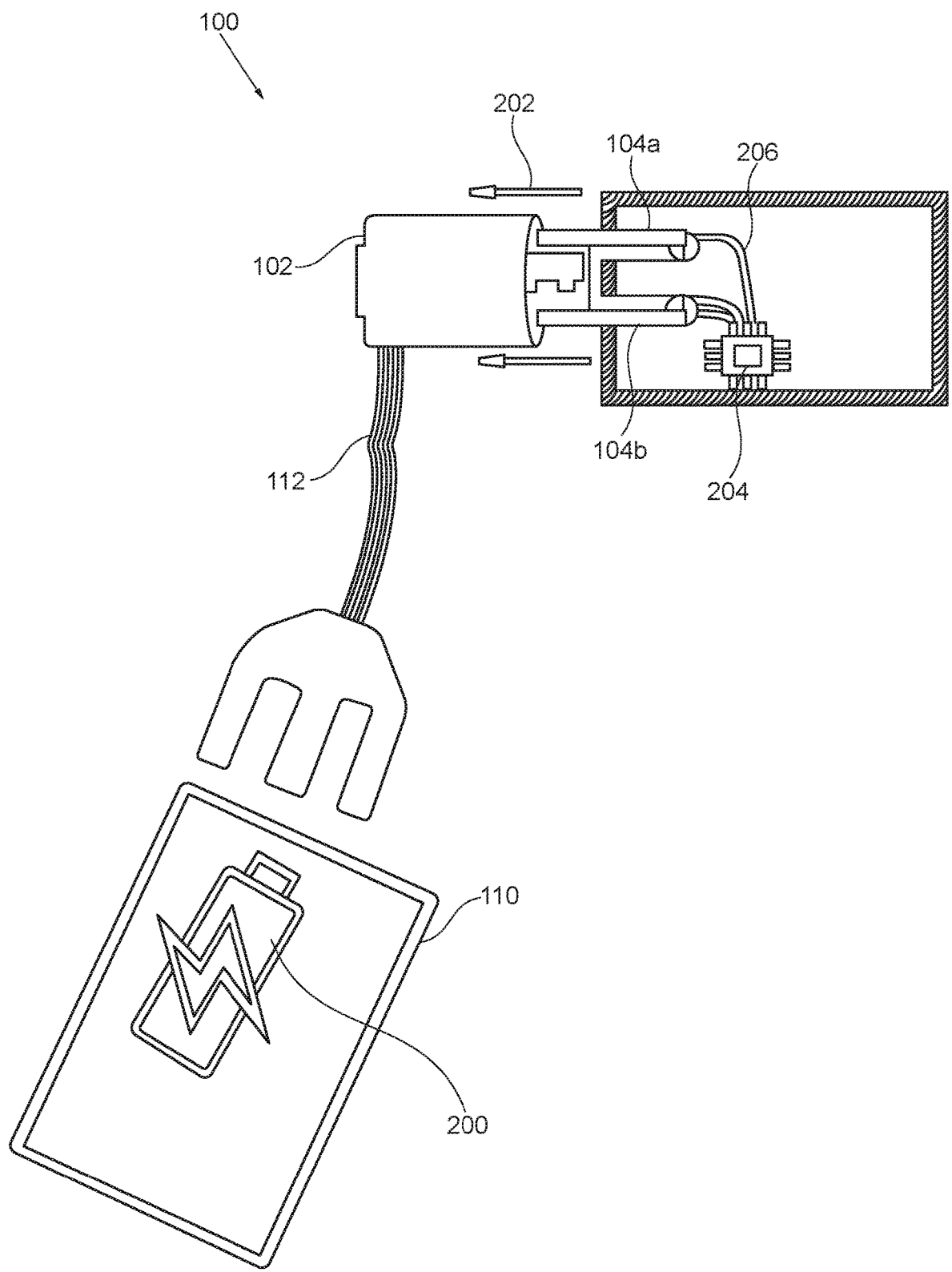
FIG. 2 illustrates a sectioned view inside a housing of the auto-eject apparatus, in accordance with an embodiment of the present invention.

An auto-eject apparatus 100 for ejecting a charging cord from a communication device after the battery is substantially charged is referenced in FIGS. 1-2. The auto-eject apparatus 100, hereafter "apparatus 100" is configured with a unique connector that ejects a proximal end 114 of a charging cord 112 that is attached to a communication device 110 after the battery 200 of the communication device 110 is substantially charged. A processor component 204 operatively connects to the pins 104a-b. The processor component 204 runs a software program that detects when the battery 200 is finished charging. The software program may be a battery monitoring program.

After detecting a full charge, the software program triggers two pins 104a-b in the apparatus 100 to mechanically eject the proximal end 114 of the charging cord 112. The pins 104a-b axially extend and retract in relation to the housing 102. Axially extending the pins 104a-b urges the connector to disengage from the communication device 110, as the USB connection therebetween is separated. Further, the apparatus 100 may also utilize a unique linkage assembly 206 articulates between the processor component and the pins 104a-b to axially displace the pins 104a-b In some embodiments, the apparatus 100 comprises a connector that serves as a *nexus* between a communication device 110 and a charging cord 112. The communication device 110 may include, without limitation, a smart phone, a tablet, a laptop, a digital camera, a mouse, a keyboard, a scanner, a media device, an external hard drive, and a flash drive. The communication device 110 is powered by a battery 200, such as a rechargeable Lithium-Polymer or Lithium Ion battery 200. The charging cord 112 may include a USB Type-C or a USB-C charging cord 112. Though in other embodiments, the charging cord 112 can include other types of chargers, USB's, and the like. The charging cord 112 comprises a proximal end 114 that detachably attaches to the communication device 110, and a distal end 116 opposing the proximal end 114. The proximal end 114 may fit into a USB port in the communication device 110.

As referenced in FIG. 1, the connector is defined by a housing 102 that serves as a protective outer layer to protect electrical components inside. The housing 102 may have a flat, rectangular shape. The housing 102 is defined by a device end 106 and a cord end 108. The device end 106 is operable to detachably attach to the communication device 110, and the battery 200 thereof. This connection may include a USB prong that fits into a USB port of the communication device 110. The cord end 108 attaches to a charging cord 112, described above.

Turning now to FIG. 2, the apparatus 100 further comprises a pair of pins 104a-b that extend from the device end 106 of the connector. In some embodiments, the pins 104a-b may include a metallic conductor having an elongated, thin configuration. The pins 104a-b are configured to axially extend and retract in relation to the housing 102. Thus, by axially extending the pins 104a-b the connector is urged to disengage from the communication device 110. In this manner, the pins 104a-b disengage the housing 102 from the communication device 110. This amounts to an auto-eject function. Conversely, the pins 104a-b axially retract when an external force 202 is applied. The external force may include a hand pushing in the pins 104a-b. This retraction allows the pins 104a, 104b to receive the communication device 110, i.e., mate with the USB port therein.

In some embodiments, the apparatus 100 may include a processor component 204 that operatively connects to the pins 104a-b. The processor component 204 may include, without limitation, a printed circuit board, a processor, a microchip, and a data storage device. The processor component 204 is configured to run a software program, and also to trigger a mechanical response to a detected event by the software program. The software program is operable to detect when the battery 200 is substantially charged. This may include a full charge, or a charge of 90% or more. In essence, the software program comprises a battery monitoring software application, as is known in the art.

In one non-limiting embodiment, the software program is operable to scan the voltage of the battery 200, whereby when the voltage reaches a predetermined value, the software program indicates a substantial charge of the battery 200 for the communication device 110. In other embodiments, the software program is operable to monitor the battery power rate, the battery capacity, and the battery power state. In yet other embodiments, the software program is operable to measure the internal resistance by a pulse of AC impedance method, count coulombs, and taking a snapshot of the battery with Electrochemical Impedance Spectroscopy. However, any processing means known in the art to detect a substantially charged battery 200, and trigger a mechanical event in response may be used.

Looking again at FIG. 2, the software program is configured to trigger the pins 104a-b to axially extend when the substantial charge is detected. Thus, a substantially charged battery causes the connector to disengage from the communication device 110. To help urge the pins 104a-b into axial extension, the apparatus 100 may utilize a linkage assembly 206 that is operable between the processor and the pins 104a-b. The linkage assembly 206 articulates to axially extend and retract the pins 104a-b. The linkage assembly 206 may include a mechanical link, or bar, or joint that moves against the pins 104a-b. In another embodiment, a servo meter, servo motor, or other electrical-mechanical connectivity means may be junctional between the linkage assembly 206 and the processor component 204 to create efficient axial motion by the pins 104a-b.

In conclusion, an auto-eject apparatus 100 ejects a proximal end of a charging cord from a communication device after the battery is substantially charged. The auto-eject apparatus serves to provides a connector that ejects a proximal end of a charging cord that is attached to a communication device after the battery of the communication device is substantially charged. A processor component operatively connects to the pins. The processor component runs a software program that detects when the battery is finished charging. The software program may be a battery monitoring program. After detecting a full charge, the software program triggers two pins in the apparatus to mechanically eject the proximal end of the charging cord. The pins axially extend and retract in relation to the housing, such that axially extending the pins urges the connector to disengage from the communication device A linkage assembly articulates between the processor component and the pins to axially displace the pins.

These and other advantages of the invention will be further understood and appreciated by those skilled in the art by reference to the following written specification, claims and appended drawings.

Because many modifications, variations, and changes in detail can be made to the described preferred embodiments of the invention, it is intended that all matters in the foregoing description and shown in the accompanying drawings be interpreted as illustrative and not in a limiting sense. Thus, the scope of the invention should be determined by the appended claims and their legal equivalence.

What is claimed is:

1. An auto-eject apparatus for charging cord, the apparatus comprising:
    a connector defined by a housing, a device end, and a cord end, the device end being operable to detachably attach to a communication device having a battery, the cord end being operable to detachably attach to a proximal end of a charging cord;
    a pair of pins extending from the device end of the connector, the pins operable to axially extend and retract in relation to the housing, whereby axially extending the pins urges the connector to disengage from the communication device; and
    a processor component operatively connected to the pins, the processor component operating a software program operable to detect when the battery is substantially charged, the software program triggering the pins to axially extend, whereby a substantially charged battery causes the connector to disengage from the communication device.

2. The apparatus of claim 1, wherein the apparatus further comprises a linkage assembly operable between the processor and the pins.

3. The apparatus of claim 2, wherein the linkage assembly articulates to axially extend and retract the pins.

4. The apparatus of claim 1, wherein the pins axially retract when an external force is applied.

5. The apparatus of claim 1, wherein the charging cord comprises a USB Type-C or a USB-C charging cord.

6. The apparatus of claim 1, wherein the housing has a flat, rectangular shape.

7. The apparatus of claim 1, wherein the charging cord has a distal end opposing the proximal end.

8. The apparatus of claim 1, wherein the communication device includes at least one of the following: a smart phone, a tablet, a laptop, a digital camera, a mouse, a keyboard, a scanner, a media device, an external hard drive, and a flash drive.

9. The apparatus of claim 1, wherein the processor component comprises a printed circuit board.

10. The apparatus of claim 1, wherein the software program is operable to scan the voltage of the battery.

11. The apparatus of claim 10, wherein the software program is operable to monitor the battery power rate, the battery capacity, and the battery power state.

12. The apparatus of claim 11, wherein the software program is operable to measure the internal resistance by a pulse of AC impedance method, count coulombs, and taking a snapshot of the battery with Electrochemical Impedance Spectroscopy.

13. The apparatus of claim 12, wherein the software program comprises a battery monitoring software application.

14. An auto-eject apparatus for charging cord, the apparatus comprising:
    a connector defined by a housing, a device end, and a cord end, the device end being operable to detachably attach to a communication device having a battery, the cord end being operable to detachably attach to a proximal end of a charging cord;
    a pair of pins extending from the device end of the connector, the pins operable to axially extend and retract in relation to the housing, whereby axially extending the pins urges the connector to disengage from the communication device;
    a processor component operatively connected to the pins, the processor component operating a software program operable to detect when the battery is substantially charged, the software program being operable to scan the voltage of the battery, the software program triggering the pins to axially extend, whereby a substantially charged battery causes the connector to disengage from the communication device; and
    a linkage assembly operable between the processor and the pins, the linkage assembly articulating to axially extend and retract the pins.

15. The apparatus of claim 14, wherein the charging cord comprises a USB Type-C or a USB-C charging cord.

16. The apparatus of claim 14, wherein the housing has a flat, rectangular shape.

17. The apparatus of claim 14, wherein the charging cord has a distal end opposing the proximal end.

18. The apparatus of claim 14, wherein the communication device includes at least one of the following: a smart phone, a tablet, a laptop, a digital camera, a mouse, a keyboard, a scanner, a media device, an external hard drive, and a flash drive.

19. The apparatus of claim 14, wherein the processor component comprises a printed circuit board.

20. An auto-eject apparatus for charging cord, the apparatus consisting of:
    a connector defined by a housing, the housing defined by a flat, rectangular shape, the housing further being defined by a device end and a cord end, the device end being operable to detachably attach to a communication device having a battery, the cord end being operable to detachably attach to a proximal end of a charging cord, the charging cord further comprising a distal end;

a pair of pins extending from the device end of the connector, the pins operable to axially extend and retract in relation to the housing, whereby axially extending the pins urges the connector to disengage from the communication device;

a processor component operatively connected to the pins, the processor component operating a software program operable to detect when the battery is substantially charged, the software program being operable to scan the voltage of the battery, the software program triggering the pins to axially extend, whereby a substantially charged battery causes the connector to disengage from the communication device; and a linkage assembly operable between the processor and the pins, the linkage assembly articulating to axially extend and retract the pins.

* * * * *